US012776789B2

(12) United States Patent
Chang et al.

(10) Patent No.: US 12,776,789 B2
(45) Date of Patent: Oct. 27, 2026

(54) METHOD FOR GENERATING LOW-DENSITY PARITY-CHECK CODE

(71) Applicant: National Yang Ming Chiao Tung University, Hsinchu City (TW)

(72) Inventors: Hsie-Chia Chang, Hsinchu City (TW); Yen-Chin Liao, Hsinchu City (TW); Yu-Lun Hsu, Huatan Township (TW); Chuan-Yun Lai, Taichung City (TW)

(73) Assignee: NATIONAL YANG MING CHIAO TUNG UNIVERSITY, Hsinchu City (TW)

( * ) Notice: Subject to any disclaimer, the term of this patent is extended or adjusted under 35 U.S.C. 154(b) by 94 days.

(21) Appl. No.: 18/930,060

(22) Filed: Oct. 29, 2024

(65) Prior Publication Data

US 2026/0051902 A1 Feb. 19, 2026

(30) Foreign Application Priority Data

Aug. 16, 2024 (TW) ................................ 113130896

(51) Int. Cl.
*H03M 13/11* (2006.01)

(52) U.S. Cl.
CPC ...... *H03M 13/116* (2013.01); *H03M 13/1185* (2013.01)

(58) Field of Classification Search
CPC ........................ H03M 13/116; H03M 13/1185
See application file for complete search history.

(56) References Cited

U.S. PATENT DOCUMENTS 7,536,623 B2 5/2009 Kim et al.

FOREIGN PATENT DOCUMENTS

CN 101075811 A 11/2007
CN 102037651 A 4/2011
(Continued)

OTHER PUBLICATIONS

Liao et al., "A (21150, 19050) GC-LDPC Decoder for NAND Flash Applications", IEEE Transactions on Circuits and Systems I: Regular Papers (vol. 66, Issue: 3, 2019, pp. 1219-1230) (Year: 2019).*
(Continued)

*Primary Examiner* — Mark D Featherstone
*Assistant Examiner* — Rong Tang
(74) *Attorney, Agent, or Firm* — Birch, Stewart, Kolasch & Birch, LLP

(57) ABSTRACT

A method for generating a low-density parity-check code, including: arranging t block matrices along a diagonal to form a local matrix, wherein the t block matrices are identical and do not overlap; the block matrix has m rows and n columns; interposing an all-zero matrix between each two adjacent columns of the block matrix to separate the n columns and form an expanded global matrix, wherein each all-zero matrix has a size of m×(t−1); permutating the expanded global matrix rightward circularly in sequence to generate t expanded global matrices, and arranging the t expanded global matrices under the local matrix in sequence to form a basic parity-check matrix. The present invention can flexibly adjust the code length and the CPM size of the basic parity-check matrix, reducing the complexity of the parity-check matrix to further simplify the implementation of the decoder hardware.

13 Claims, 6 Drawing Sheets

(56) References Cited

FOREIGN PATENT DOCUMENTS

| | | | |
|---|---|---|---|
| CN | 105207681 | A | 12/2015 |
| CN | 105227190 | A | 1/2016 |
| CN | 109309502 | A | 2/2019 |

OTHER PUBLICATIONS

Li et al., "Globally coupled LDPC codes", Information Theory and Applications Workshop (ITA), IEEE, 2016, pp. 1-10 (Year: 2016).*

Hsu et al., "GC-Like LDPC Code Construction and Its NN-Aided Decoder Implementation", IEEE Open Journal of Circuits and Systems, Feb. 6, 2024, vol. 5, pp. 189-198.

Li et al., "Globally coupled LDPC codes", Information Theory and Applications Workshop (ITA), IEEE, 2016, pp. 1-10.

* cited by examiner $$H_0 = \underbrace{\begin{bmatrix} 0 & 0 & 0 & \ldots\ldots & 1 \\ 0 & 1 & 1 & \ldots\ldots & 1 \\ 1 & 0 & 1 & \ldots\ldots & 1 \end{bmatrix}}_{V_N} \Big\} C_M$$

$$\begin{bmatrix} 0 & 0 & 0 \\ 0 & 0 & 0 \\ 0 & 0 & 0 \end{bmatrix}$$

29

$$\begin{bmatrix} 1 & 0 & 0 \\ 0 & 1 & 0 \\ 0 & 0 & 1 \end{bmatrix}$$

30

$$\begin{bmatrix} 0 & 1 & 0 \\ 0 & 0 & 1 \\ 1 & 0 & 0 \end{bmatrix}$$

31

Fig.6

METHOD FOR GENERATING LOW-DENSITY PARITY-CHECK CODE

BACKGROUND OF THE INVENTION

This application claims priority for the TW patent application No. 113130896 filed on 16 Aug. 2024, the content of which is incorporated by reference in its entirely.

FIELD OF THE INVENTION

The present invention relates to a data coding method, particularly to a method for generating a low-density parity-check code.

DESCRIPTION OF THE PRIOR ART

In a communication system, the requirement for a low-density parity-check code is to flexibly adjust the length of the code and cyclically replace the size of the matrix. The design of the low-density parity-check code of a NAND flash memory is focused on tow aspects: long block length and high code rate so as to achieve superior error correction capability and lower data bit storage cost.

FIG. 1A shows a low-density parity-check matrix H0, which is an M×N matrix having M lows and N columns, wherein M=3. The number of rows represents the number of check nodes, and the number of columns represents the number of variable nodes. In FIG. 1A, the low-density parity-check matrix $H_0$ has three check nodes. FIG. 1B shows a Tanner graph of the low-density parity-check matrix $H_0$. The Tanner graph expresses the connection relationship of the check nodes and the variable nodes. While the element of the low-density parity-check matrix $H_0$ is “1”, it indicates that a connection exists between the check node and the variable node. While the element of the low-density parity-check matrix $H_0$ is “0”, it indicates that no connection exists between the check node and the variable node. The Tanner graph of FIG. 1B shows the relationships between three check nodes ($C_1$-$C_3$) and n variable nodes ($V_1$-$V_n$). The low-density parity-check matrix $H_0$ is sparse in characteristics, which means that “1” is very few and “0” is numerous. The product of a vector and the low-density parity-check matrix $H_0$ is “0”.

Among low-density parity-check matrices, there is a globally-coupled (GC) low-density parity-check code. FIG. 2 shows a GC low-density parity-check matrix Boc, which includes a local matrix 12 on the upper region and a global matrix 14 on the lower region. The local matrix 12 consists of t $B_{Local}$, wherein each $B_{Local}$ is a low-density parity-check code having a shorter code length. The global matrix 14 is expressed by $B_{Global}$. The check nodes and the variable nodes of the Tanner graph, which are corresponding to the t $B_{Local}$, are not connected to each other unless they are connected through the global matrix 14. The GC low-density parity-check matrix Boc can exchange the information of the block matrices, whereby to promote the error correction ability.

A conventional technology proposes a method of using algebra to establish a GC low-density parity-check code according to Equation (1):

$$B_0 = \begin{bmatrix} \alpha^0-1 & \alpha^1-1 & \alpha^2-1 & \dots & \alpha^{q-2}-1 \\ \alpha^{q-2}-1 & \alpha^0-1 & \alpha^1-1 & \dots & \alpha^{q-3}-1 \\ \vdots & \vdots & \ddots & \vdots & \vdots \\ \alpha^1-1 & \alpha^2-1 & \dots & \alpha^{q-1}-1 & \alpha^0-1 \end{bmatrix} \quad (1)$$

wherein a Galois field GF (q) is used to establish the matrix $B_0$; α is a primitive element of GF (q). A superstition method may be used to replace the coefficients inside the matrix $B_0$ with circulant permutation matrices (CPM) having a size of (q−1)×(q−1). Suppose that q−1=l×r. Thus, $B_0$ may be regarded as being formed by r×r small matrices having a size of l×l. Next, m columns and n rows are taken out from one l×l matrix, and the intersection thereof may form a $B_{Local}$ having a size of m×n. The local matrix 12 for GC low-density parity-check operation may be established via duplicating t $B_{Local}$. As to the (l−m) rows that are not selected, s rows are picked therefrom. Further, n elements of the rows, which are picked by $B_{Local}$, are taken out from t/x/matrices to form an s×(t×n) $B_{Global}$. As any 2×2 matrix of $B_0$ is a nonsingular matrix, $B_{GC}$ meets the row-column (RC) constraint. Such a structure favors effectively integrating the information of the local matrices 12 and the global matrix 14 in the GC low-density parity-check operation, whereby the coding function is promoted. However, the algebraic code forming method involves complicated encoding processes. Thus, the conventional technology does not bring an obvious advantage to the low-density parity-check coder/decoder. Because the acquired GC low-density parity-check code is limited by the algebraic characteristics, the code length and the CPM (circulant permutation matrix) size are limited.

Accordingly, the present invention proposes a method for generating a low-density parity-check code to overcome the conventional problems and meet the future requirement. The principle and embodiments of the present invention will be described in detail below.

SUMMARY OF THE INVENTION

The primary objective of the present invention is to provide a method for generating a low-density parity-check (LDPC) code, which is not limited by the algebraic characteristics but able to flexibly adjust the code length and the CPM (circulant permutation matrix) size.

Another objective of the present invention is to provide a method for generating a low-density parity-check code, wherein the global matrix thereof is formed by local matrices, whereby to effectively reduce the complexity of the LDPC matrix and simplify the implementation of the decoder hardware.

To achieve the abovementioned objectives, the present invention provides a method for generating a low-density parity-check code, which is realized by a coding device, and which comprises steps: (a) arranging t block matrices along a diagonal to form a local matrix, wherein the t block matrices are identical and do not overlap, t>1, wherein the block matrix has m rows and n columns, and m and n are natural numbers; (b) interposing an m×(t−1) all-zero matrix into each two adjacent columns of the block matrix to separate the neighboring n columns of the block matrix and form an expanded global matrix; (c) circularly permutating the expanded global matrix rightward in sequence to generate/expanded global matrices, and arranging the/expanded global matrices below the local matrices to form a basic parity-check matrix.

In one embodiment, each of the t block matrices meets a row-column constraint.

In one embodiment, each non-zero elements of the t block matrices is a circulant permutation matrix; each circulant permutation matrix has a size of $Z_c$×$Z_c$, wherein $Z_c$>2.

In one embodiment, an element “−1” of the basic parity-check matrix is replaced by an all-zero matrix, and each of other integer elements from 0 to "$Z_c-1$" is replaced by the circulant permutation matrix and circularly permutated rightward by n columns to expand the basic parity-check matrix into a parity-check matric whose code length meets requirement.

In one embodiment, further comprising the method for generating a circulant permutation matrix includes steps: randomly generating a permutation coefficient; circularly permutating a unit matrix rightward according to the permutation coefficient to form a circulant permutation matrix.

In one embodiment, after the basic parity-check matrix is generated, examine whether the basic parity-check matrix meets a row-column constraint; if the basic parity-check matrix does not meet the row-column constraint, generate a new permutation coefficient and back to step (a); if the basic parity-check matrix meets the row-column constraint, the establishment of the basic parity-check matrix is completed.

In one embodiment, the basic parity-check matrix has a size of (2m×t)×(n×t).

In one embodiment, the basic parity-check matrix has a column degree of 2m and a row degree of n.

In one embodiment, Tanner graphs of the t block matrices are not connected to each other, and the Tanner graphs of the t block matrices are connected to each other through the t expanded global matrix.

In one embodiment, Tanner graphs of the expanded global matrices are not connected to each other, and the Tanner graphs of the expanded global matrices are connected to each other through the t block matrices.

In one embodiment, further comprising a decoding method of the basic parity-check matrix comprises steps: dividing the basic parity-check matrix into a plurality block codes, wherein each block code includes a plurality of code words, and the block code are the block matrices; performing local decoding to each block code; performing global decoding to the basic parity-check matrix, wherein a plurality of block information, which is generated in the decoding process, will be transferred to other block codes; repeating the transformation decoding between the local decoding and the global decoding until iteration converges.

BRIEF DESCRIPTION OF THE DRAWINGS

FIG. 6 is a diagram schematically showing the circulant permutation matrices that are respectively generated using different permutation coefficients according to one embodiment of the present invention.

DETAILED DESCRIPTION OF THE INVENTION

The technical schemes of the embodiments of the present invention will be clearly and fully described in cooperation with the attached drawings below. It should be understood: the embodiments described thereinafter are not all the embodiments but only a portion of the embodiments of the present invention.

It should be understood: while the term "comprise", "include", or the like is used in the specification and the claims, it means the existence of special technical characteristics, entireties, steps, operations, elements, and/or components. However, the statement involving "comprise", "include" or the like does not excluded the existence of additional technical characteristics, entireties, steps, operations, elements, and/or components, or combinations thereof.

It should be also understood: the terms used in the specification of the present invention are only to describe specified embodiments but not to limit the scope of the present invention. While used in the specification and claims of the present invention, the singular noun, which is described by "one", "one piece of" or "the", implies the plural form thereof unless the context indicates another condition clearly.

It should be further understood: the term "and/or" used in the specification and claims of the present invention refers to one or several of the listed items or any possible combination of the listed items, and the present invention includes these combinations.

The present invention provides a method for generating a low-density parity-check code. The method of the present invention may be realized by various operating systems, operating platforms, computer programs and/or general-purpose machines. For example, the method of the present invention may be realized by a coding device, which has a hardware component or a hardware-software integration component able to process data and/or graphs, such as a computer device, a cloud server, or a barebone. The operation and processing of the coding device may be implemented by a central processing unit (CPU), a graphics processing unit (GPU), or a single chip microcontroller (MCU). The method of the present invention comprises a series of steps, which may be realized by a computer or a machine, and which may be stored in instructions readable by machines. For example, the instructions may be stored in a physical medium, such as a computer memory device (a read only memory (ROM), a programmable read only memory (PROM), an electronically erasable programmable ROM (EEPROM), a flash memory, or a Jump Drive), a magnetic storage medium (a magnetic tape or a disc drive), an optical storage medium (CD-ROM, DVD-ROM, paper cards, or paper tapes), or another known existing program memory.

Figure 3:
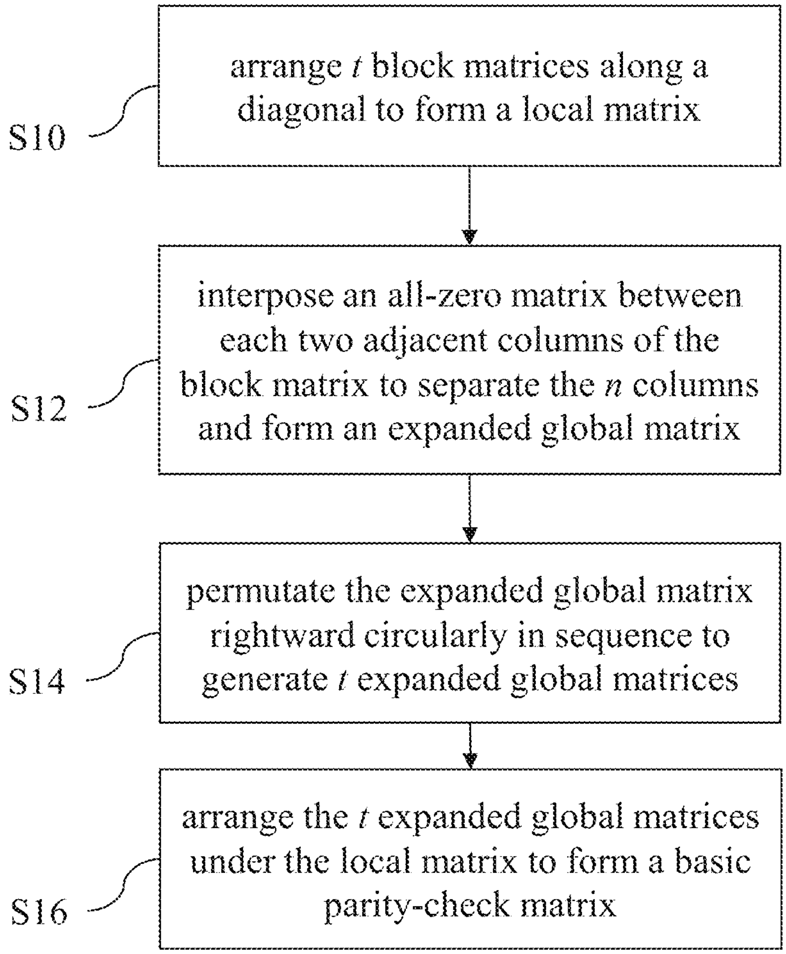
FIG. 3 is a flowchart of a method for generating a low-density parity-check code according to one embodiment of the present invention.

Refer to FIG. 3 for a flowchart of a method for generating a low-density parity-check code of the present invention. The steps of the flowchart may be executed via performing the instructions stored in the memory device. Also refer to FIG. 4 and FIG. 5 for the embodiments of the present invention.

Figures 1A, 1B:
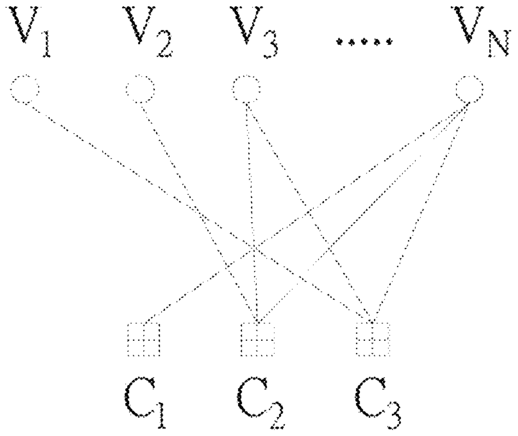
Fig.1A (Prior Art)
Fig.1B (Prior Art)
FIG. 1A and FIG. 1B are diagrams respectively schematically showing a conventional low-density parity-check code and a Tanner graph thereof.
Figure 2:
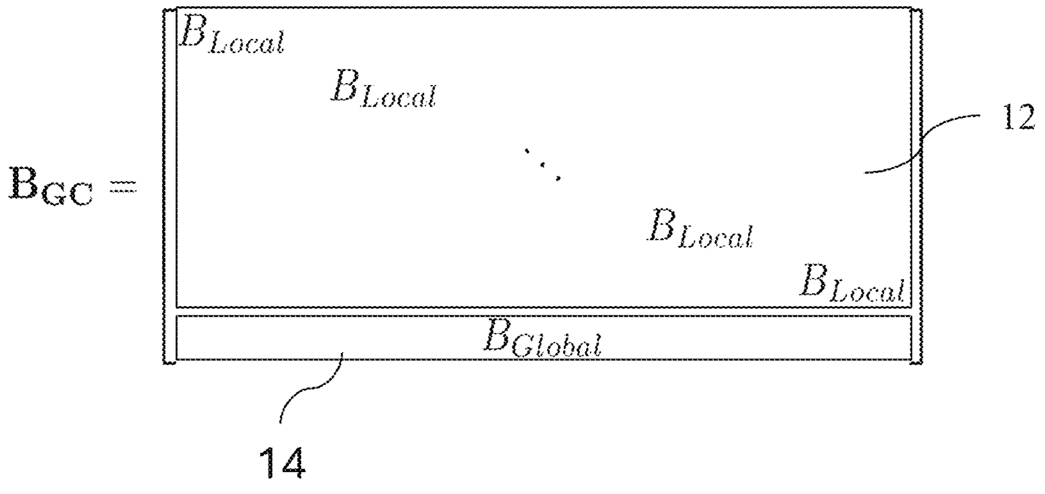
Fig.2 (Prior Art)
FIG. 2 is a diagram schematically showing a conventional globally-coupled low-density parity-check matrix.
Figure 4:
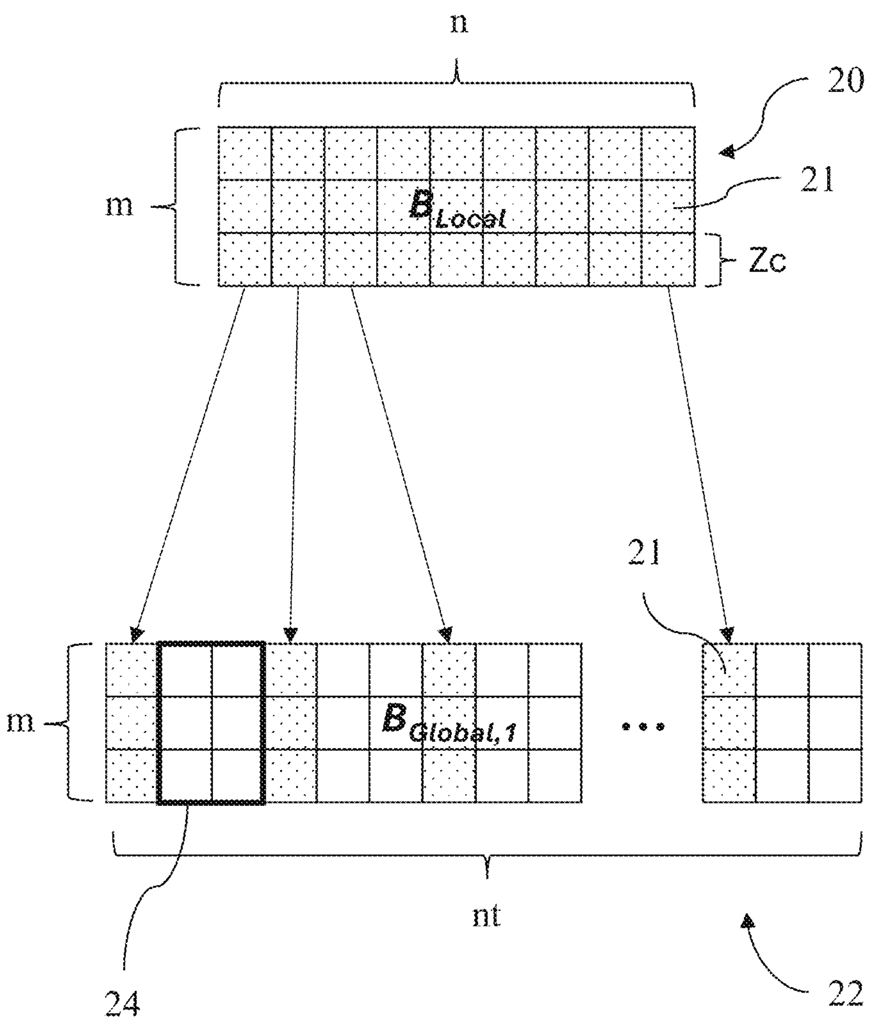
FIG. 4 is a diagram schematically showing that all-zero matrices are interposed into block matrices to form an expanded global matrix according to one embodiment of the present invention.
Figure 5:
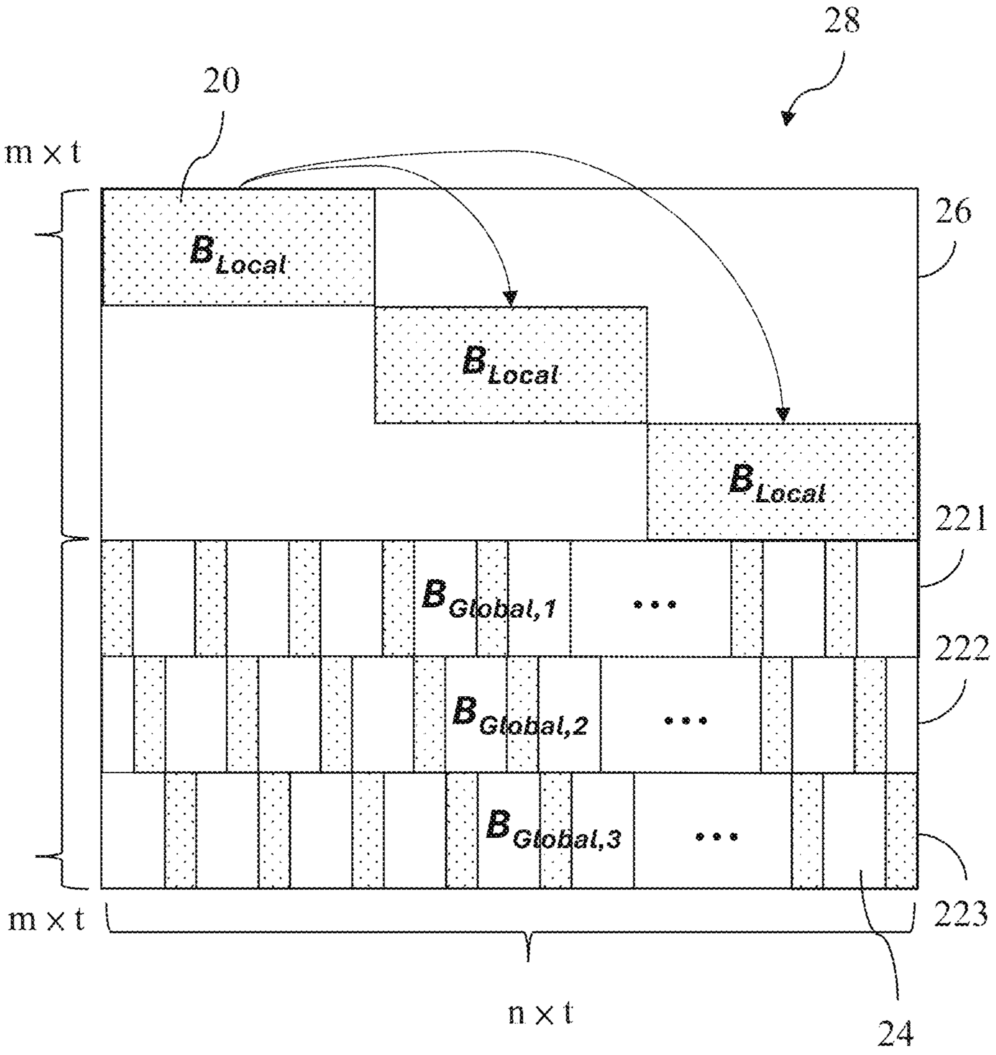
FIG. 5 is a diagram schematically showing that the expanded global matrix is permutated rightward circularly in sequence and that the expanded global matrices are arranged below the local matrix to form a basic parity-check matrix according to one embodiment of the present invention.

In Step S10, establish a block matrix 20 (i.e. $B_{Local}$), and arrange t block matrices 20 along a diagonal to form a local matrix. As shown in FIG. 5, the upper half of the basic parity-check matrix is a local matrix 26, which is formed by t block matrices 20, t>1. The t block matrices 20 are identical and do not overlap. The block matrix 20 has m rows and n columns, and m and n are natural numbers greater than 1. The block matrix 20 shown in FIG. 4 is an m×n matrix, which meets a row-column constraint of the low-density parity-check matrix. The row-column constraint is also called the cycle-4 constraint. In other words, each check node having passed through a variable node would not return to the same check node lest a loop be formed. For example, in FIG. 1B, $V_2$ is connected to $C_2$; $C_2$ is connected to $V_N$; $V_N$ is connected to $C_3$; $C_3$ is connected to $V_1$; thus, no loop is formed, and it is a correct parity-check matrix. If $C_3$ is not connected to $V_1$ but connected to $V_2$, a loop $V_2$-$C_2$-$V_N$-$C_3$-$V_2$ is formed. Thus, it does not meet the row-column constraint. In the local matrix 26, all elements are "0" except the t block matrices 20 along the diagonal.

Step S12 and Step S14 are to establish a global matrix of the low-density parity-check code. In Step S12, interpose a plurality of all-zero matrices into the block matrix 20 to separate the n neighboring columns of the block matrix 20 and form an expanded global matrix 22. As shown in FIG. 4, an all-zero matrix 24 having a size of m×(t−1) is interposed into every two adjacent columns to make the size of each column increase from m to m×1. Suppose that 1-3. In Step S10, the block matrix 20 is tripled, and the block matrices 20 are arranged along the diagonal. In Step S12, each column is tripled; all the elements of the interposed two columns are filled with "0". Thus, each m×n block matrix becomes an m×nt expanded global matrix 22.

In Step S14, rightward permutation is circularly performed on the expanded global matrix to generate/expanded global matrices. Suppose that there are i $B_{Global}$. Every column of $B_{Global,i}$ is rightward permutated circularly by an element code. The number of the circular permutations is "t−1", and the column is permutated rightward by an element code. Thus are generated $B_{Global,1}$, $B_{Global,2}$, $B_{Global,3}$ in FIG. 5. $B_{Global,1}$ is a first expanded global matrix 221. $B_{Global,2}$ is a second expanded global matrix 222. $B_{Global,3}$ is a third expanded global matrix 223. The first expanded global matrix 221 is permutated rightward by an element code to form the second expanded global matrix 222. The second expanded global matrix 222 is permutated rightward by an element code to form the third expanded global matrix 223.

In Step S16, arrange the t expanded global matrices 22, such as $B_{Global,1}$, $B_{Global,2}$, $B_{Global,3}$ in FIG. 5, below the local matrix 26 in sequence to form a basic parity-check matrix 28. The expanded global matrices 22, which are arranged in the lower part, have the same size as the local matrix 26, which is arranged in the upper part. Therefore, the basic parity-check matrix 28 has a size of (2m×t)×(n×t). The column degree of the basic parity-check matrix 28 is 2m. In other words, each column has 2m "1". The row degree of the basic parity-check matrix 28 is n. In other words, each row has n "1".

In the basic parity-check matrix 28 established according to the method of the present invention, a Tanner graph of the t block matrices are not connected to each other, but the Tanner graph of the t block matrices are connected to each other through the expanded global matrix. Similarly, a Tanner graph of the expanded global matrices are not connected to each other, but the Tanner graph of the expanded global matrices are connected to each other through the t block matrices.

In FIG. 4, the element codes of the block matrix $B_{Local}$ 20 includes −1 and the integers from 0 to $Z_c$−1, wherein each element code may be a smaller square matrix having a size of $Z_c$×$Z_c$, wherein $Z_c$>2. If the element code is −1, it may be replaced by an all-zero matrix. If the element code is one of the integers from 0 to $Z_c$−1, it may be replaced by a circulant permutation matrix (CPM) 21. Each of the all-zero matrix and the circulant permutation matrices has a size of $Z_c$×$Z_c$. The all-zero matrix 24 in FIG. 4 is formed by m×(t−1) all-zero matrices having a size of $Z_c$×$Z_c$. The original block matrix is only a small matrix. If each element code is replaced by a $Z_c$×$Z_c$ matrix, the original block matrix will be expanded $Z_c$ times. Suppose that CPM is a square matrix has a size of 128×128 and includes a plurality of zero elements and a plurality of non-zero elements, wherein each column and each row in the square matrix have a non-zero element at most, and the square matrix meets the row-column constraint. If each non-zero element is replaced by one CPM, the block matrix will be expanded 128 times. If the abovementioned operation is applied to FIG. 5, the basic parity-check matrix 28 will be expanded $Z_c$ times in length and width and becomes a parity-check matrix having the required code length. Thus, the parity-check matrix can be practically used in code error examination.

The process of generating CPM includes a step: randomly generating a permutation coefficient, and performing a random column permutation or a random row permutation to form a circulant permutation matrix 21. Refer to FIG. 6. Suppose that CPM is a square matrix having a size of 3×3. If the permutation coefficient is −1, the generated matrix is the matrix 29. If the permutation coefficient is 0, the generated matrix is the matrix 29. If the permutation coefficient is 1, the generated matrix is the matrix 31.

After the basic parity-check matrix 28 has been generated in Step S26, a step is further undertaken: examining whether the basic parity-check matrix 28 meets the row-column constraint. If the basic parity-check matrix 28 does not meet the row-column constraint, a new permutation coefficient is generated to form a new block matrix 20 and establish a new basic parity-check matrix 28. If the parity-check matrix 28 meets the row-column constraint, the establishment of the basic parity-check matrix 28 is completed.

The decoding method of the basic parity-check matrix 28 includes a local decoding stage and a global decoding stage. Firstly, divide the basic parity-check matrix 28 into a plurality of local codes, wherein each local code includes a plurality of code words. Thus, the local codes are block matrices 20. Next, in the local decoding stage, perform local decoding on the local codes (block matrix) $B_{Local}$, wherein the code words of the local code (block matrix) $B_{Local}$ may be decoded independently; the part whose environment is worse may be decoded firstly. The information will be iterated between the block variable nodes and the block check nodes many times. In the global decoding stage of the basic parity-check matrix, the block information generated during the decoding process will be transferred to other local codes through global connection. The decoding process will be switched between local decoding and global decoding until iteration converges.

In conclusion, the method for generating a low-density parity-check code of the present invention includes steps: designing a block matrix having a shorter code length; duplicating the block matrix to form a local matrix; and expanding the local matrix into a global matrix. In other words, the global matrix is formed by block matrices. Therefore, the code length and the CPM size of the basic parity-check matrix established by the present invention may be adjusted flexibly. Besides, the present invention can effectively reduce the complexity of the parity-check matrix to further simplify the implementation of the decoder hardware.

The embodiments described above are only to demonstrate the present invention but not to limit the scope of the present invention. Any modification or variation according to the spirit or characteristics of the present invention is to be also included by the scope of the present invention.

What is claimed is:

1. A method for generating a low-density parity-check code for use in storage applications, the method comprising:

(a) arranging t block matrices along a diagonal to form a local matrix, wherein the t block matrices are identical and do not overlap, t>1, wherein the block matrix has m rows and n columns, m and n are integers greater than 1;

(b) interposing an all-zero matrix between each two adjacent columns of the block matrix to separate the neighboring n columns and form an expanded global matrix, wherein each all-zero matrix has a size of $m\times(t-1)$; and (c) permutating the expanded global matrix rightward circularly in sequence to generate t expanded global matrices and arranging the t expanded global matrices under the local matrix to form a basic parity-check matrix;

wherein the identical block matrices define repeated local decoding structures for iterative message passing between block variable nodes and block check nodes and the basic parity-check matrix supports hierarchical iterative decoding including a local decoding stage and a global decoding stage;

wherein during the local decoding stage, message passing is independently performed within each local code;

wherein during the global decoding stage, decoding information is propagated across distinct local codes through global connections established by the expanded global matrices, and the iterative decoding alternating between the local decoding stage and the global decoding stage until convergence is achieved.

2. The method for generating the low-density parity-check code according to claim 1, wherein each of the t block matrices meets a row-column constraint.

3. The method for generating the low-density parity-check code according to claim 1, wherein each non-zero elements of the t block matrices is a circulant permutation matrix having a size of $Z_c\times Z_c$, wherein $Z_c>2$.

4. The method for generating the low-density parity-check code according to claim 3, wherein an element "−1" of the basic parity-check matrix is replaced by an all-zero matrix, and each of other integer elements from 0 to "$Z_c-1$" is replaced by a circulant permutation matrix and permutated rightward circularly by n columns to expand the basic parity-check matrix into a parity-check matrix having a required code length.

5. The method for generating the low-density parity-check code according to claim 3, further comprising a process of generating the circulant permutation matrix includes steps:

randomly generating a permutation coefficient; performing a random column permutation or a random row permutation on a unit matrix according to the permutation coefficient to form the circulant permutation matrix.

6. The method for generating the low-density parity-check code according to claim 4, further comprising a process of generating the circulant permutation matrix includes steps:

randomly generating a permutation coefficient; performing a random column permutation or a random row permutation on a unit matrix according to the permutation coefficient to form the circulant permutation matrix.

7. The method for generating the low-density parity-check code according to claim 5, further comprising steps:

examining whether the basic parity-check matrix meets a row-column constraint; and if the basic parity-check matrix does not meet the row-column constraint, generating a new permutation coefficient and back to step (a); if the basic parity-check matrix meets a row-column constraint, completing establishment of the basic parity-check matrix.

8. The method for generating the low-density parity-check code according to claim 6, further comprising steps:

examining whether the basic parity-check matrix meets a row-column constraint; and if the basic parity-check matrix does not meet the row-column constraint, generating a new permutation coefficient and back to step (a); if the basic parity-check matrix meets the row-column constraint, completing establishment of the basic parity-check matrix.

9. The method for generating the low-density parity-check code according to claim 1, wherein the basic parity-check matrix has a size of $(2m\times1)\times(n\times t)$.

10. The method for generating the low-density parity-check code according to claim 1, wherein the basic parity-check matrix has a column degree of 2m and a row degree of n.

11. The method for generating the low-density parity-check code according to claim 1, wherein Tanner graphs of the t block matrices are not connected to each other, and the Tanner graphs of the t block matrices are connected to each other through the t expanded global matrices.

12. The method for generating the low-density parity-check code according to claim 1, wherein Tanner graphs of the t expanded global matrices are not connected to each other, and the Tanner graphs of the expanded global matrices are connected to each other through the t block matrices.

13. The method for generating the low-density parity-check code according to claim 1, further comprising a decoding method of the basic parity-check matrix comprises steps:

dividing the basic parity-check matrix into a plurality of local codes, wherein each local code includes a plurality of code words; the local codes are the block matrices;

performing local decoding on each of the local codes;

performing global decoding on the basic parity-check matrix, wherein a plurality of block information generated during decoding is transferred to other local codes; and switching between the local decoding and the global decoding repeatedly until iteration converges.

* * * * *